(12) United States Patent
Jin et al.

(10) Patent No.: US 11,526,042 B2
(45) Date of Patent: *Dec. 13, 2022

(54) FLEXIBLE DISPLAY PANEL AND DISPLAY APPARATUS INCLUDING THE FLEXIBLE DISPLAY PANEL

(71) Applicant: Samsung Display Co., Ltd., Yongin-si (KR)

(72) Inventors: Dong-Un Jin, Yongin-si (KR);
Woo-Jong Lee, Yongin-si (KR);
Yang-Wan Kim, Yongin-si (KR);
Young-Sik Kim, Yongin-si (KR);
Jun-Sang Lyu, Yongin-si (KR);
Sang-Min Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/385,776

(22) Filed: Jul. 26, 2021

(65) Prior Publication Data

US 2021/0356798 A1 Nov. 18, 2021

Related U.S. Application Data

(63) Continuation of application No. 16/794,604, filed on Feb. 19, 2020, now Pat. No. 11,073,708, which is a (Continued)

(30) Foreign Application Priority Data

Jun. 30, 2011 (KR) .................. 10-2011-0065145

(51) Int. Cl.
*G02F 1/1333* (2006.01)
*G06F 1/16* (2006.01)

(52) U.S. Cl.
CPC .. *G02F 1/133305* (2013.01); *G02F 1/133308* (2013.01); *G06F 1/1637* (2013.01); *H01L 2251/533* (2013.01)

(58) Field of Classification Search
CPC ......... H01L 2251/533; G02F 1/133305; G02F 1/13308; G06F 1/1632
See application file for complete search history.

(56) References Cited

U.S. PATENT DOCUMENTS 7,884,808 B2 2/2011 Joo
2003/0227441 A1 12/2003 Hioki et al.
(Continued)

FOREIGN PATENT DOCUMENTS

JP 2001-154592 A 6/2001
JP 2007-333818 12/2007
(Continued)

OTHER PUBLICATIONS

KIPO Notice of Allowance dated Aug. 27, 2013, for Korean priority Patent application 10-2011-0065145, (2 pages).
(Continued)

*Primary Examiner* — Lisa S Landis
(74) *Attorney, Agent, or Firm* — Lewis Roca Rothgerber Christie LLP

(57) ABSTRACT

A flexible display panel includes a flexible substrate including a first region including a display region and having a curved display surface, and a plurality of non-display regions that is located outside the display region and including a second region located outside the first region and folded in a direction different from a display direction of the first region, and an encapsulation member for encapsulating the display region along the curved display surface.

21 Claims, 10 Drawing Sheets

Related U.S. Application Data continuation of application No. 15/936,341, filed on Mar. 26, 2018, now Pat. No. 10,578,897, which is a continuation of application No. 13/367,151, filed on Feb. 6, 2012, now Pat. No. 9,927,641.

(56) References Cited

U.S. PATENT DOCUMENTS

| | | |
|---|---|---|
| 2006/0098153 A1 | 5/2006 | Slikkerveer et al. |
| 2007/0103776 A1 | 5/2007 | Cok et al. |
| 2007/0211002 A1* | 9/2007 | Zehner ............... G02F 1/1679 345/84 |
| 2009/0085900 A1* | 4/2009 | Weiner ............... G06K 19/04 345/530 |
| 2010/0208494 A1 | 8/2010 | Kuo et al. |
| 2011/0002500 A1 | 1/2011 | Park |
| 2011/0007042 A1* | 1/2011 | Miyaguchi ........ G02F 1/133305 345/204 |
| 2011/0018025 A1 | 1/2011 | Bertram |
| 2011/0050657 A1 | 3/2011 | Yamada |
| 2011/0134145 A1 | 6/2011 | Moriwaki |
| 2012/0127087 A1 | 5/2012 | Ma |
| 2012/0242588 A1 | 9/2012 | Myers et al. |
| 2012/0274575 A1* | 11/2012 | Solomon ............... G06F 3/0488 345/1.3 |

FOREIGN PATENT DOCUMENTS

| | | |
|---|---|---|
| JP | 2010-191246 | 9/2010 |
| JP | 5446790 B2 | 3/2014 |
| KR | 10 2005 0085066 | 8/2005 |
| KR | 10-2008-0024504 | 3/2008 |
| KR | 10 20080096063 A | 10/2008 |
| KR | 10-2011-0000744 | 1/2011 |
| KR | 10 20110030732 A | 3/2011 |
| KR | 10-2011-0068169 | 6/2011 |

OTHER PUBLICATIONS http://shopping.naver.com/detail/detail.nhn?cat_id=00110100&nv_mid=5731982718&frm=nv_model, (1 page).

* cited by examiner

FLEXIBLE DISPLAY PANEL AND DISPLAY APPARATUS INCLUDING THE FLEXIBLE DISPLAY PANEL

CROSS-REFERENCE TO RELATED PATENT APPLICATIONS

This application is a continuation of U.S. patent application Ser. No. 16/794,604, filed Feb. 19, 2020, which is a continuation of U.S. patent application Ser. No. 15/936,341, filed Mar. 26, 2018, now U.S. Pat. No. 10,578,897, which is a continuation of U.S. patent application Ser. No. 13/367,151, filed Feb. 6, 2012, now U.S. Pat. No. 9,927,641, which claims priority to and the benefit of Korean Patent Application No. 10-2011-0065145, filed Jun. 30, 2011, the entire content of all of which is incorporated herein by reference.

BACKGROUND

1. Field

One or more embodiments of the present invention relate to a flexible display panel and a display apparatus including the flexible display panel.

2. Description of Related Art

Display apparatuses refer to apparatuses that display an image signal. Such display apparatuses include televisions (TVs), computer monitors, personal digital assistants (PDAs), and smart devices, which are increasingly in demand, and which display an image corresponding to a signal input by an external device.

A flat panel display module with high image quality, such as an organic light-emitting display panel, a liquid crystal display (LCD) panel, a plasma display panel (PDP), or the like, is used in display apparatuses.

The flat panel display module includes a display region in which an image is displayed, and a non-display region in which various circuits and wirings for supplying an image signal to the display region are located. In this regard, the non-display region is outside the display region on a same plane as that of the display region.

As demand for high image quality and various applications of display apparatuses is recently increasing, the number of circuits and wirings located in the non-display region of the flat panel display module is also increasing. Thus, the area of the non-display region has increased, which causes a reduction in the percentage in the flat panel display of the display region that is recognized by a user. Thus, a design of display apparatuses needs to be improved.

SUMMARY

One or more embodiments of the present invention provide a flexible display panel that provides a user with an aesthetically pleasing design of a curved surface, and that significantly decreases the size ratio of a non-display region to a display region recognized by a user, and a display apparatus including the flexible display panel.

According to an aspect of embodiments of the present invention, there is provided a flexible display panel including a flexible substrate including a first region including a display region and having a curved display surface, and a plurality of non-display regions that is located outside the display region and including a second region located outside the first region and folded in a direction different from a display direction of the first region, and an encapsulation member for encapsulating the display region along the curved display surface.

The first region may have a constant curvature radius.

The first region may have a concave display surface.

The flexible display panel may further include a border region having a curvature radius and located between the first and second regions.

The curvature radius may have a constant value.

The curvature radius may be between 0.01 mm and 10 mm.

The border region may be convex.

The first region may extend in the border region.

The second region may extend in the border region.

The first region and the second region may extend in the border region.

The flexible substrate may further include a third region that extends in the second region and is folded towards an inside of the first region.

The flexible display panel may further include a pad unit located in the third region.

The flexible display panel may further include a barrier layer located between the flexible substrate and the display region.

The flexible display panel may further include a support unit for maintaining a shape of the flexible display panel.

The encapsulation member may be a flexible encapsulation thin layer.

The flexible display panel may further include a touch panel located on at least one side of the flexible substrate and the encapsulation member, and an image of the display region may be displayed through the touch panel.

The touch panel may include a flexible film that is foldable to correspond to a shape of the flexible display panel.

The touch panel may include a touch region located on the flexible film and corresponding to the display region, and a wiring region located outside the touch region.

According to another aspect of embodiments of the present invention, there is provided a flexible display panel including a display region having a concave curved surface, and a non-display region located outside the display region and folded in a direction different from a display direction of the display region, wherein an area ratio of an area of the non-display region to an area of the display region visible from a front of the display region when the non-display region is folded is smaller than the area ratio visible from the front of the display region when the non-display region is not folded.

The display region may have a constant curvature radius.

A curved surface having a curvature radius may be located between the display region and the non-display region.

The curved surface may be convex.

The display region may include an organic light-emitting device.

According to another aspect of embodiments of the present invention, there is provided a display apparatus including a flexible display panel including a display region having a concave curved surface, and a non-display region located outside the display region and folded in a direction different from a display direction of the display region, wherein an area ratio of an area of the non-display region to an area of the display region visible from a front of the display region when the non-display region is folded is smaller than the area ratio visible from the front of the display region when the non-display region is not folded, and a support member for maintaining a shape of the flexible display panel.

The display apparatus may further include an encapsulation thin layer for encapsulating the display region, a touch panel located on the encapsulation thin layer and including a touch region having a curved surface corresponding to the display region, and at least one organic light-emitting device located in the display region.

The display apparatus may further include a transparent protection window located on the touch panel and corresponding to curved shapes of the flexible display panel and the touch panel.

BRIEF DESCRIPTION OF THE DRAWINGS

The above and other features and aspects of embodiments of the present invention will become more apparent by describing in detail exemplary embodiments thereof with reference to the attached drawings in which.

DETAILED DESCRIPTION

Embodiments of the present invention will now be described more fully with reference to the accompanying drawings, in which exemplary embodiments of the invention are shown.

Figure 1:
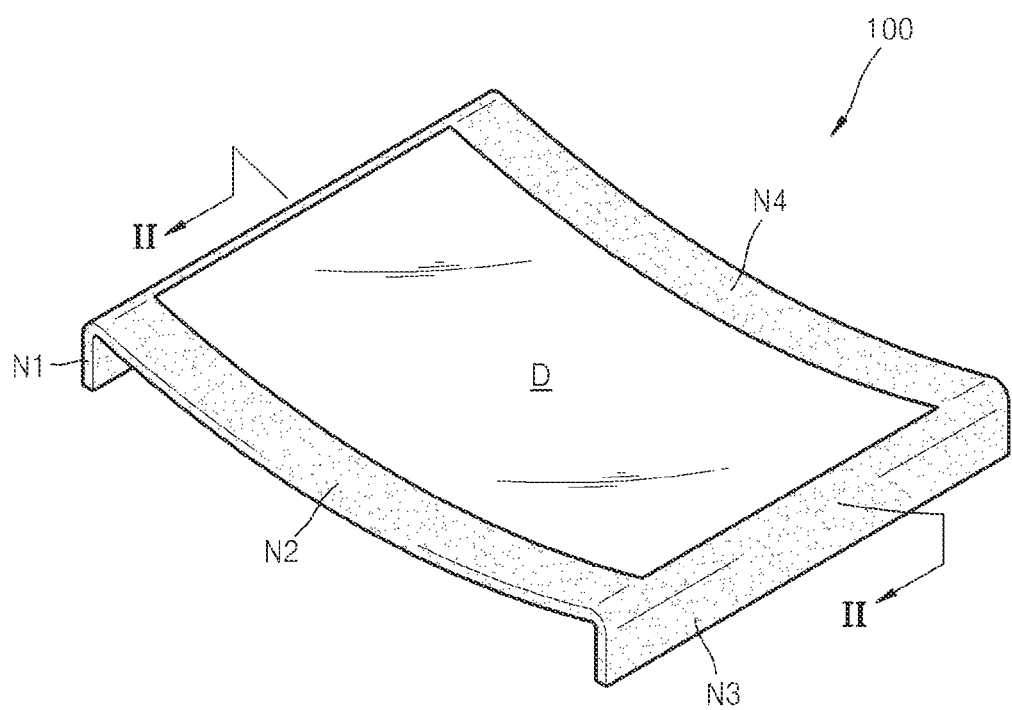
FIG. 1 is a schematic perspective view of a flexible display panel according to an embodiment of the present invention.
Figure 2:
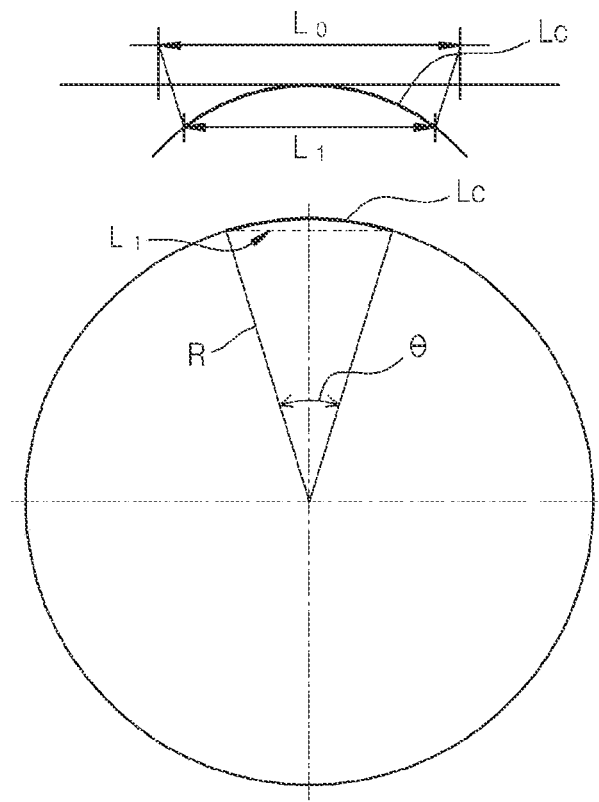
FIG. 2 is a cross-sectional view of the relationship between a curvature radius and the size of a display region.
Figure 3:
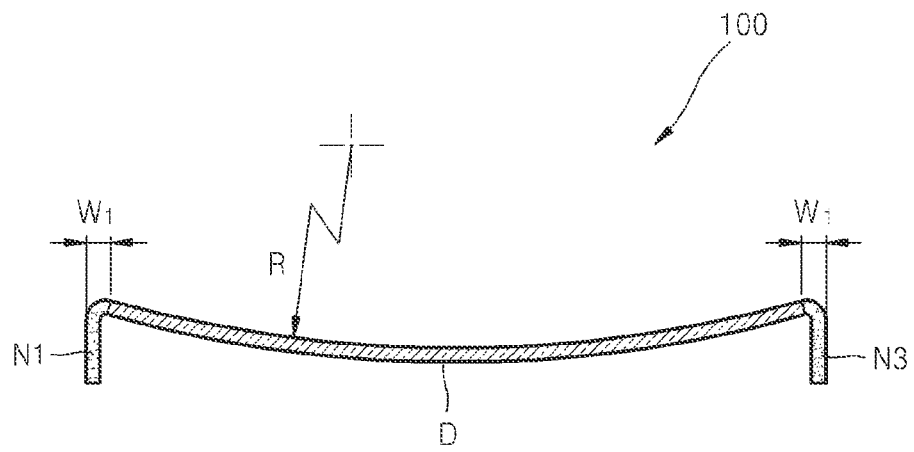
FIG. 3 is a cross-sectional view of the flexible display panel of the embodiment illustrated in FIG. 1, taken along the line II-II of FIG. 1.

FIG. 1 is a schematic perspective view of a flexible display panel 100 according to an embodiment of the present invention, FIG. 2 is a cross-sectional view of the relationship between a curvature radius and the size of a display region, and FIG. 3 is a cross-sectional view of the flexible display panel 100 of the embodiment illustrated in FIG. 1, taken along the line II-II of FIG. 1.

Referring to FIG. 1, the flexible display panel 100 of the present embodiment includes a display region D and non-display regions N1, N2, N3, and N4 outside the display region D. The non-display regions N1 and N3 that face each other across the display region D are located along opposite sides of the display region, and are folded in a direction (rear sheet) opposite to a direction (front sheet) in which the display region D displays an image (e.g., a display direction).

The display region D is formed as a concave curved surface. The curved surface of the display region D may have a constant curvature radius (e.g., a predetermined constant curvature radius). For example, the curved surface may be a portion of a cylinder.

When the display region D is formed as a concave curved surface, as in the present embodiment, the same field of view can be obtained with a smaller area in comparison to a display region D that is formed as a plane.

Referring to FIG. 2, in a display panel having a view size of $L_0$ (e.g., a view size having a length of $L_0$), when the display region D is formed as a concave curved surface that has a constant curvature radius R (an actual length of the curved surface is $L_c$), as in the present embodiment, a length $L_1$ projected onto (e.g., a length $L_1$ of an image projected onto) a plane of the concave curved surface is smaller than the view size $L_0$ of the flat display panel. Thus, an area of the plane of the concave curved surface is smaller than the area of the flat display panel while applying the same view size, and the size of the display panel may be reduced. Reversely, the view size that is larger than that of the display panel may be obtained with the same occupation area.

For example, in the case of a smartphone that has the view size $L_0$ of 4.5 inches, a demand for which has recently increased, a length $L_1$ projected onto a plane of a concave curved surface that has a curvature radius R of 600 mm may be 4.49 inches (in this case, θ is 10.9°). As another example, in the case of a smartphone that has the view size $L_0$ of 4.5 inches, a length $L_1$ projected onto a plane of a concave curved surface that has a curvature radius R of 300 mm may be 4.47 inches (in this case, θ is 21.8°). In other words, in the case of a smartphone that has the view size $L_0$ of 4.5 inches, the curvature radius R of the concave curved surface is adjustable in a range of about 100 mm to 700 mm, thereby satisfying the same specification of view size with a smaller occupation area.

Referring to FIG. 3, because the non-display regions N1 and N3 are folded in the direction (rear sheet) opposite to the direction (front sheet) in which an image from the display region D is displayed, when a user sees the flexible display panel 100 from the front of the display region D, the user recognizes a width $W_1$ at which the non-display regions N1 and N3 are folded, as a border on two or more sides of (e.g., a border that surrounds upper and lower sides of) the display region D.

Because the width $W_1$ at which the non-display regions N1 and N3 are folded becomes much smaller than an original width (e.g., see $W_0$ of FIG. 5) before the non-display regions N1 and N3 are folded, the user recognizes (e.g., perceives) that the border of the display region D formed by the non-display regions N1 and N3 is significantly decreased in size.

When there is no change in the respective areas of the display region D measured before and after the non-display regions N1 and N3 are folded, the area ratio of the non-display regions N1 and N3 to the display region D recognized by the user is decreased, and thus, the effects of relatively enlarging the display region D may be realized.

Because a width of the display region D may be enlarged by the decreased width ($W_0$-$W_1$) of the non-display regions N1 and N3 (e.g., a ratio of the area the display region D to the area of the non-display regions N1 and N3 may be increased), when the flexible display panel 100 is applied to a display apparatus having the same specifications as that of the flexible display panel 100 (e.g., a display apparatus having approximately the same dimensions as the flexible display panel 100), the flexible display panel 100 may implement an enlarged image screen as compared to other display panels.

Figure 4:
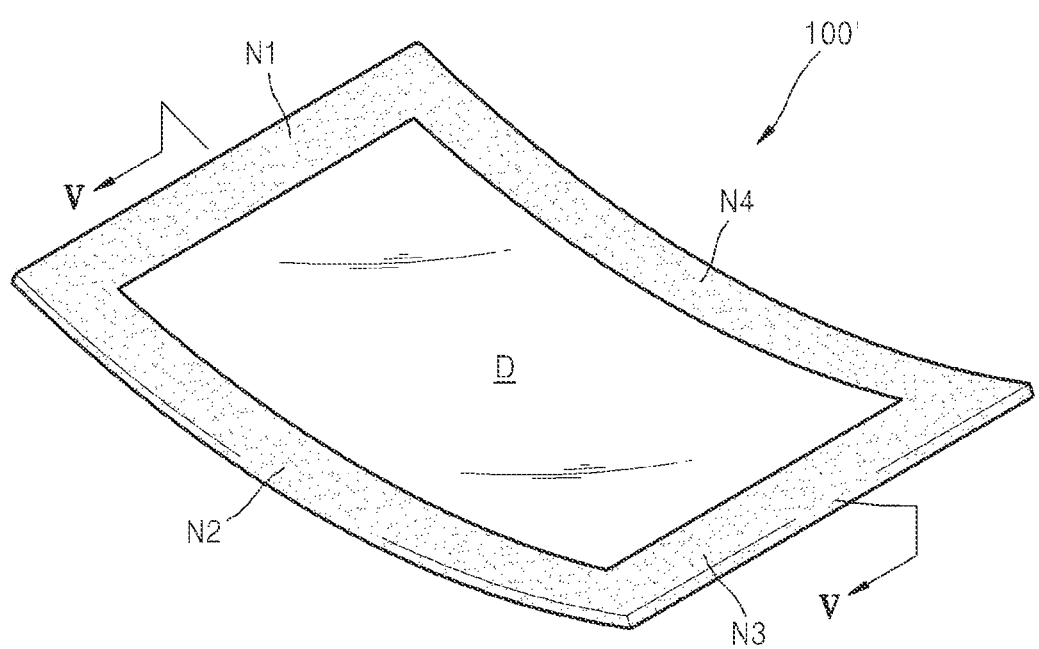
FIG. 4 is a schematic perspective view of a display panel including a concave display surface on which a non-display region is not folded, as a comparative example of the embodiment shown in FIG. 1.
Figure 5:
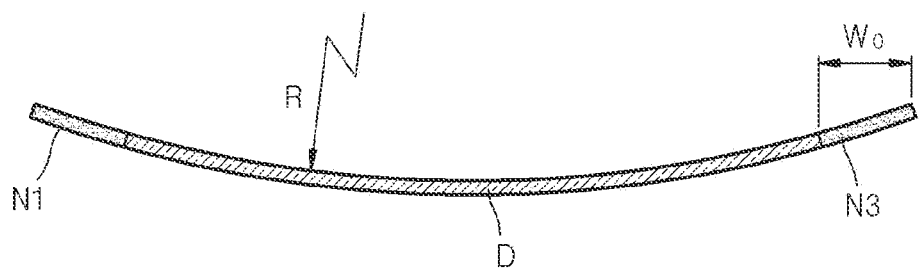
FIG. 5 is a cross-sectional view of the display panel illustrated in FIG. 4, taken along the line V-V of FIG. 4.

FIG. 4 is a schematic perspective view of a display panel 100' including a concave display surface in which the non-display regions N1, N2, N3, and N4 are not folded, as a comparative example of the display panel 100 of the embodiment shown in FIG. 1, and FIG. 5 is a cross-sectional view of the display panel 100' of FIG. 4, taken along the line V-V of FIG. 4.

Referring to FIGS. 4 and 5, the display panel 100', in which the non-display regions N1, N2, N3, and N4 are not folded, includes a display region D and non-display regions N1, N2, N3, and N4 that are located outside the display region D.

Because the non-display regions N1 and N3 are not folded, when the user sees the display panel 100' from the front (front sheet) of the display region D, the user recognizes the original width $W_0$ of the non-display regions N1 and N3 as a border that surrounds upper and lower sides of the display region D (e.g., a border that is located on both sides of the upper and lower sides of the display region D). Thus, a thicker border of the display region D formed by the non-display regions N1 and N3 is recognized by the user, as compared to the flexible display panel 100 of the embodiment shown in FIG. 1 and described above.

When the total area of the display region D and the non-display regions N1 and N3 of the flexible display panel 100 of the embodiment shown in FIG. 1 is the same as the total area of the display region D and the non-display regions N1 and N3 of the display panel 100' of FIG. 4, the area ratio of the non-display regions N1 and N3 to the display region D of the flexible display panel 100 of FIG. 1 perceived by the user is decreased compared to that of the display panel 100' of the comparative example, so that the effects of enlarging a display screen may be shown.

In the case of the display panel 100' according to the comparative example, in order to reduce the area of the non-display regions N1 and N3, the number of various circuits or wirings located in the non-display regions N1 and N3 has to be decreased, or line widths of circuits or wirings have to be decreased. However, because of demand for high image quality and various applications of a display apparatus is increasing, there are limitations in reducing the number of circuits or wirings. In addition, there is a process difficulty in reducing line widths of the circuits or wirings.

However, in the flexible display panel 100 of the embodiment shown in FIG. 1, the area of the non-display regions N1 and N3 recognized by the user may be decreased without reducing the number of circuits or wirings located in the non-display regions N1 and N3 and without reducing line widths of the circuits or wirings.

Figure 6:
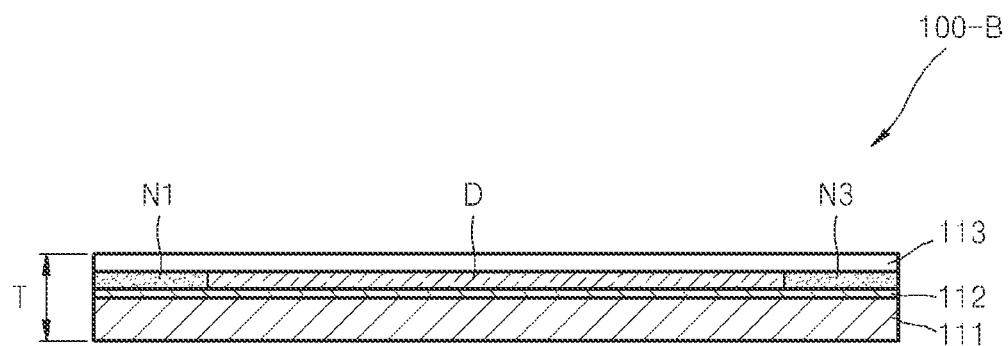
FIG. 6 is a schematic cross-sectional view of the flexible display panel of the embodiment shown in FIG. 1 before non-display regions are folded.
Figure 7:
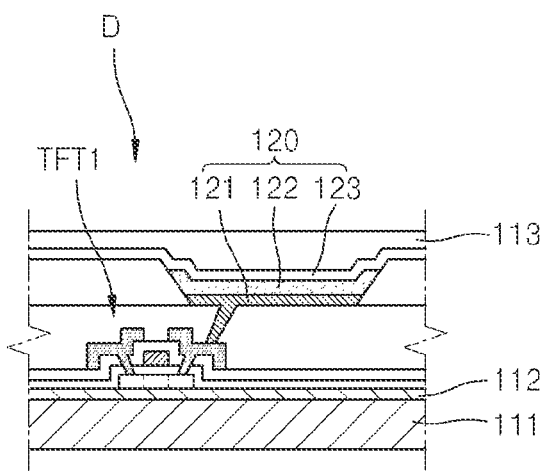
FIG. 7 is a cross-sectional view of an example of a display region of the embodiment shown in FIG. 6.
Figure 8:
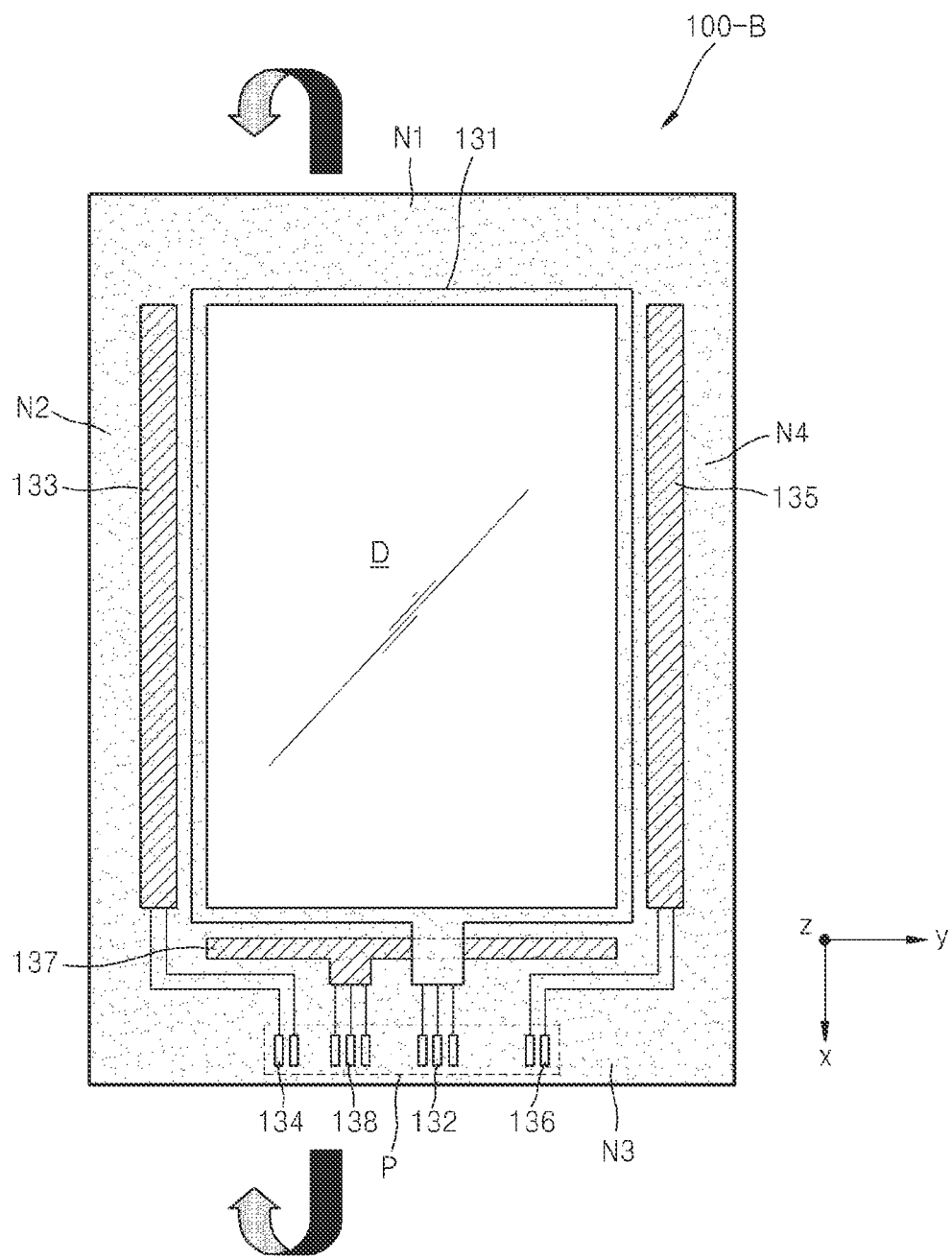
FIG. 8 is a plane view of an example of non-display regions of the embodiment shown in FIG. 6.

FIG. 6 is a schematic plane view of an example of a flexible display panel 100-B of an embodiment of the present invention before the non-display regions N1 and N3 (e.g., N1 and N3 of the embodiment shown in FIG. 1) are folded, FIG. 7 is a cross-sectional view of an example of a display region D of the embodiment shown in FIG. 6, and FIG. 8 is a plane view of an example of non-display regions N1, N2, N3, and N4 of the embodiment shown in FIG. 6.

Referring to FIGS. 6 through 8, the flexible display panel 100-B before the non-display regions N1 and N3 are folded includes a flexible substrate 111, a barrier layer 112 located on the flexible substrate 111, a display region D and non-display regions N1, N2, N3, and N4 located on the barrier layer 112, and an encapsulation member 113.

The flexible substrate 111 may be formed of a plastic material having excellent heat-resistance and durability, such as polyethylene ether phthalate, polyethylene naphthalate, polycarbonate, polyarylate, polyetherimide, polyethersulfone, polyimide, or the like. However, the present invention is not limited thereto, and the flexible substrate 111 may be formed of various flexible materials.

The barrier layer 112 may be located on the flexible substrate 111. The barrier layer 112 may be formed of at least one of an inorganic layer and an organic layer. The barrier layer 112 prevents unnecessary components from transmitting into the flexible substrate 111 and from permeating into the display region D.

The display region D and the non-display regions N1, N2, N3, and N4 outside the display region D may be located on the barrier layer 112.

An image corresponding to an image signal is displayed in the display region D, and various display devices, such as organic light-emitting display devices, liquid crystal display (LCD) devices, electrophoresis display devices, and the like may be located in the display region D. In the present embodiment, an organic light-emitting device 120 is described. Various devices, such as thin film transistors (TFTs) and capacitors for driving the devices, and the like may also be located in the display region D.

Referring to FIG. 7, at least one organic light-emitting device 120 (e.g., an organic light emitting diode) is located in the display region D. The organic light-emitting device 120 includes a pixel electrode 121, an opposite electrode 123 that is a common layer (e.g., a common electrode), and an organic emission layer 122 between the pixel electrode 121 and the opposite electrode 123. The pixel electrode 121 is electrically coupled to a driving thin film transistor TFT1 located on the flexible substrate 111. Although not shown in FIG. 6, the organic light-emitting device 120 is electrically coupled to at least one switching thin film transistor and storage capacitor, thereby emitting light from the display region D.

Light may be emitted from the organic emission layer 122 towards the flexible substrate 111 or the encapsulation member 113. In the present embodiment, a top-emission type display device in which an image is displayed towards the encapsulation member 113 is described. However, the present invention is not limited thereto, and different embodiments may apply to a bottom-emission type display device in which an image is displayed towards the flexible substrate 111. In the case of the bottom-emission type display device, the non-display regions N1 and N3 are folded in a direction opposite to a direction in which an image is displayed, that is, towards the encapsulation member 113.

Various circuits and wirings for supplying an image signal to the display device located in the display region D may be located in the non-display regions N1, N2, N3, and N4.

Referring to FIG. 8, an electrode power supply line 131 for supplying power to the opposite electrode 123, and a terminal portion 132 of the electrode power supply line 131 are located in the non-display regions N1, N2, N3, and N4.

A scan circuit unit 133 for transmitting a driving signal to the display region D and a terminal portion 134 of the scan circuit unit 133 are located (e.g., respectively located) in the non-display regions N2 and N3. A data circuit unit 135 for transmitting a data signal to the display region D and a terminal portion 136 of the data circuit unit 135 are located (e.g., respectively located) in the non-display regions N4 and N3. A driving power wiring unit 137 for supplying driving power to the display region D and a terminal portion 138 of the driving power wiring unit 137 are located in the non-display region N3. A pad unit P, on which the terminal portions 132, 134, 136, and 138 are located, is located in the non-display region N3.

Various circuits, wirings, and terminal portions illustrated in FIG. 8 are just illustrative of an example of the non-display regions N1, N2, N3, and N4. In other words, obviously, various circuits, wirings, and terminal portions located in the non-display regions N1, N2, N3, and N4 may have a different locations and configurations from those of FIG. 7.

Referring back to FIG. 6, the encapsulation member 113 for encapsulating at least the display region D may be located in the display region D and the non-display regions N1, N2, N3, and N4. The encapsulation member 113 may be an encapsulation thin layer. The encapsulation thin layer may have a structure including a plurality of inorganic layers, or may have a structure in which an inorganic layer and an organic layer are alternately stacked.

The flexible display panel 100-B has a thickness (e.g., a predetermined thickness) T. The thickness T may be obtained by summing up the thickness of the flexible substrate 111, the thickness of the barrier layer 112, the thickness of the display region D/the non-display regions N1, N2, N3, and N4, and the thickness of the encapsulation member 113.

Although not shown in FIG. 6, a protective film may be further located on the flexible substrate 111 and/or the encapsulation member 113. In this regard, the thickness T of the flexible display panel 100-B may be larger than that of the embodiment shown in FIG. 6.

Figure 9:
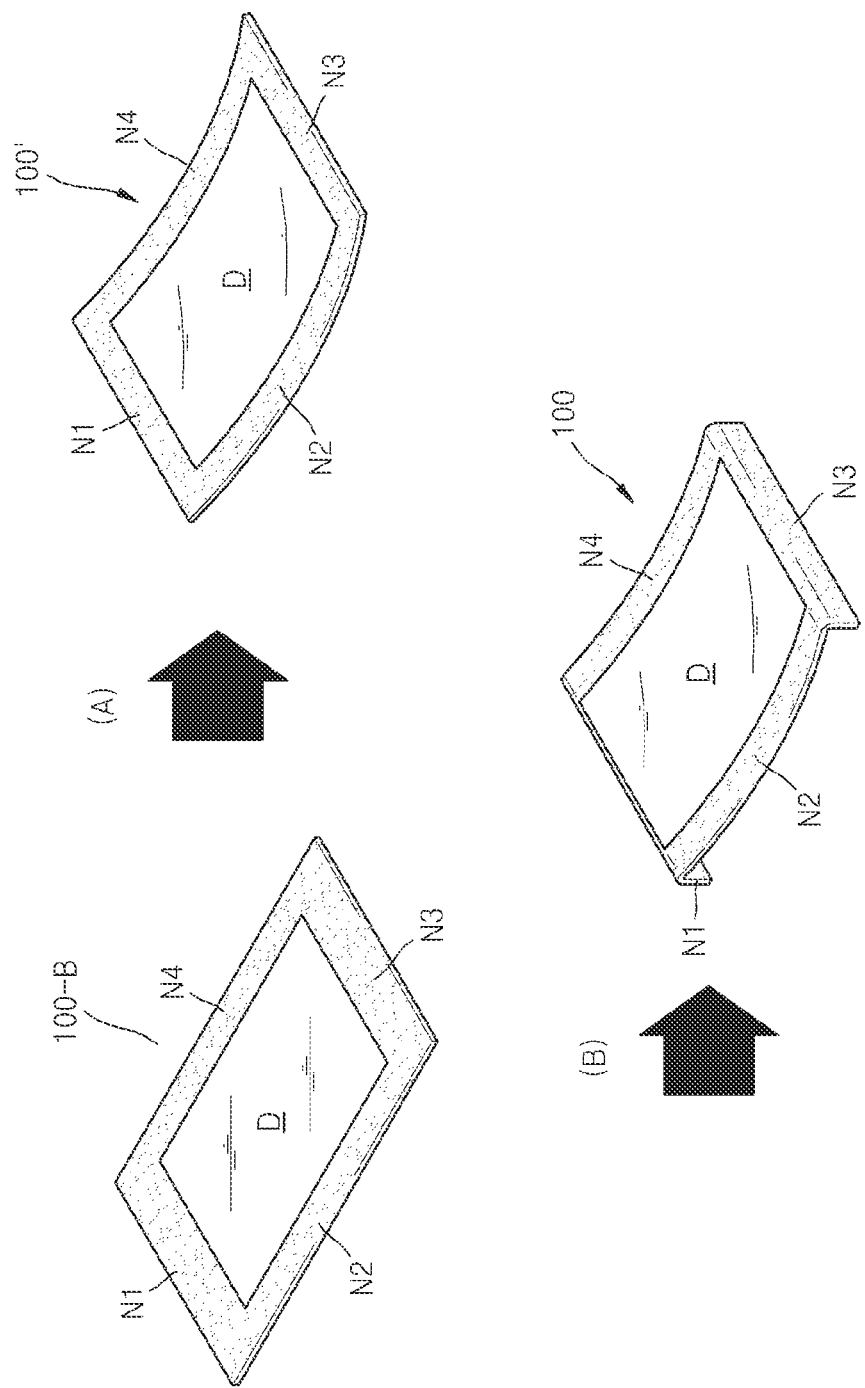
FIG. 9 is a schematic view illustrating an operation of manufacturing the flexible display panel of the embodiment shown in FIG. 1.

FIG. 9 is a schematic view illustrating a method of manufacturing the flexible display panel 100 of the embodiment shown in FIG. 1.

Referring to FIG. 9, first, a flexible display panel 100-B before non-display regions N1 and N3 are folded is bent to constitute a flexible display panel 100' including a curved surface that has a curvature radius (e.g., a predetermined curvature radius) in operation (A). Then, the non-display regions N1 and N3 on upper and lower sides of a display region D are folded in a direction opposite to a direction in which the display region D is displayed, thereby manufacturing the flexible display panel 100 according to the present embodiment in operation (B). Obviously, the order of operations (A) and (B) may be switched.

Figure 10:
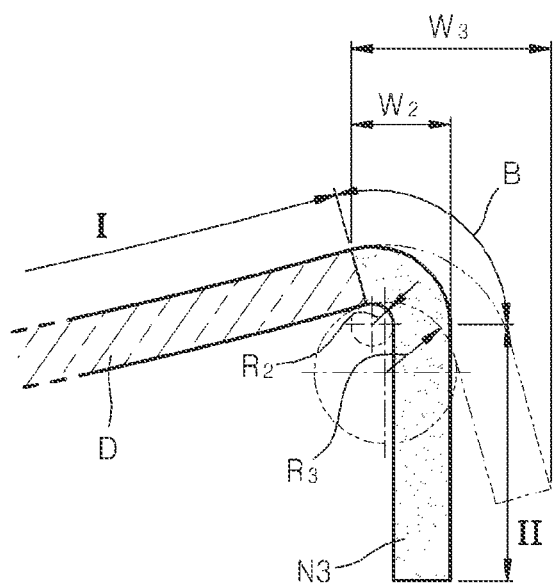
FIG. 10 illustrates the relationship between an inner curvature radius of a border region and a width of non-display regions recognized by a user.

FIG. 10 illustrates the relationship between an inner curvature radius of a border region and a width of non-display regions recognized by a user.

Referring to FIG. 10, a border region B that has a curved surface (e.g., a predetermined curved surface) is formed between a display region D (e.g., first region I) and a non-display region N3 (e.g., second region II). The border region B is formed as a curved surface that has a curvature radius (e.g., a predetermined curvature radius) $R_2$ or $R_3$.

When the curvature radius of the border region B is $R_2$, a width $W_2$ of the non-display region N3 recognized by the user is smaller than a width $W_3$ of the non-display region N3 recognized by the user, which corresponds to a curvature radius of R3. In other words, as the curvature radius of the border region B decreases, the width of the non-display region N3 recognized by the user decreases. Thus, the curvature radius of the border region B may be as small as possible. In other words, as the curvature radius of the border region B increases ($R_3 > R_2$), the width $W_3$ of the non-display region N3 recognized by the user increases ($W_3 > W_2$).

The inner curvature radius R of the portion in which the display region D and the non-display region N3 are folded may be between 0.01 mm and 10 mm according to embodiments of the present invention. When the inner curvature radius of the portion is less than 0.01 mm, due to bending stress, the flexible display panel 100 may not be maintained in a folded state, and when the inner curvature radius of the portion is greater than 10 mm, the width $W_3$ of the non-display region N3 increases. In particular, in the case of a small display apparatus, the range of the curvature radius may be selected as being less than 1 mm so that the width $W_3$ of the non-display region N3 recognized by the user may be further decreased.

In the present embodiment, the non-display region N3 of the second region II extends in the border region B. However, the present invention is not limited thereto.

For example, the display region D of the first region I may extend in the border region B. In this regard, when the user sees the flexible display panel 100 folded from the front of the display region D, a width of the non-display region N3 recognized by the user may be nearly 0. In this case, the user may recognize that the non-display region N3 may be almost borderless.

Both the display region D of the first region I and the non-display region N3 of the second region II may be located in the border region B. In this case, a display region formed in the border region B may be formed by extending the display region D of the first region I, and a non-display region formed in the border region B may be formed by extending the non-display region N3 of the second region II.

In the case of the flexible display panel 100 of FIG. 1, the non-display regions N1 and N3 on sides of the display region D are folded. However, the present invention is not limited thereto. In other words, the spirit and scope of the present invention also applies to a case where any suitable one or more of the non-display regions N1, N2, N3, and N4 are folded.

Figure 11:
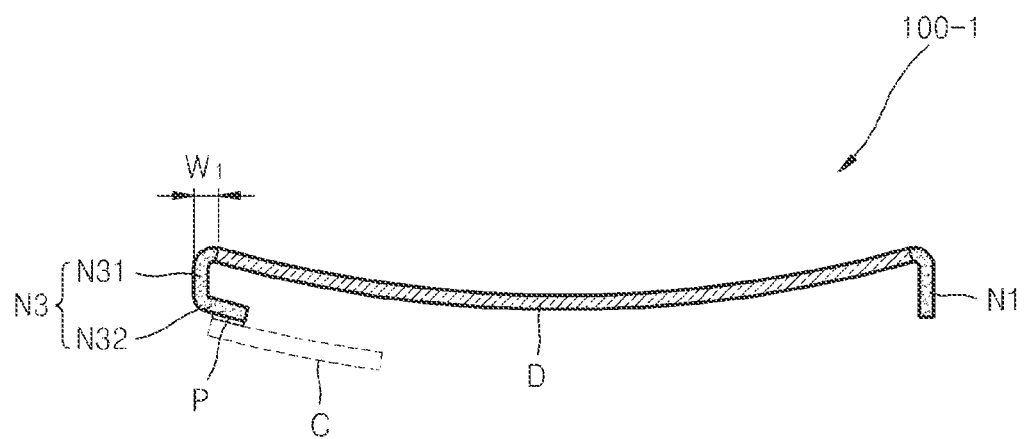
FIG. 11 is a schematic cross-sectional view of a flexible display panel according to a modified example of the embodiment shown in FIG. 1 according to another embodiment of the present invention.

FIG. 11 is a schematic cross-sectional view of a flexible display panel 100-1 according to a modified example of the embodiment shown in FIG. 1.

Referring to FIG. 11, the non-display region N3 of the flexible display panel 100 of the embodiment illustrated in FIG. 1, in which the pad unit P is located, is again folded, and is folded towards an inside of the flexible display panel 100-1.

Because an external driver has to be installed at the pad unit P, or a connector C has to be coupled to the pad unit P, when the external driver is installed at, or the connector C is coupled to, the pad unit P in the state of FIG. 1, the width of the non-display region N1 recognized by the user may be increased.

However, when, as in the present modified example, a region N32 of the non-display region N3 in which the pad unit P is located is further folded towards the inside of the flexible display panel 100-1, the external driver or the connector C is located inside the flexible display panel 100-1 so that the width of the non-display region N3 recognized by the user is not changed.

Figure 12:
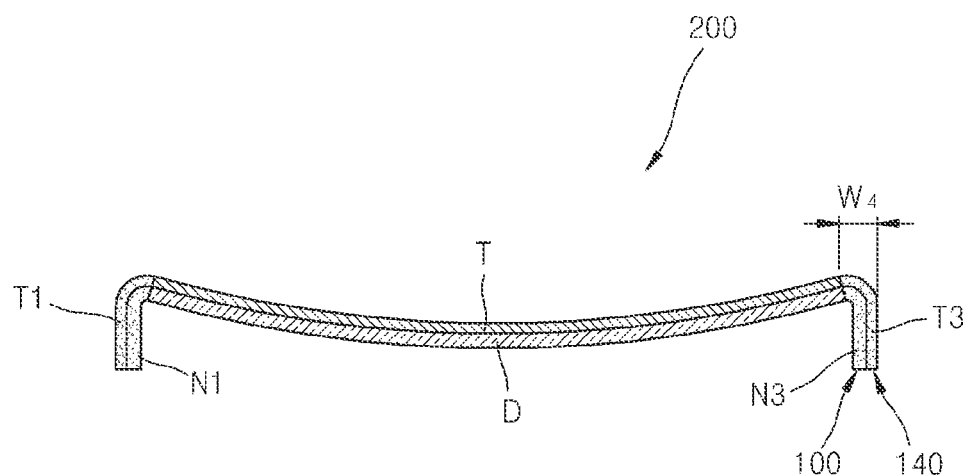
FIG. 12 is a cross-sectional view of a flexible display panel-integrated touch panel according to another embodiment of the present invention.
Figure 13:
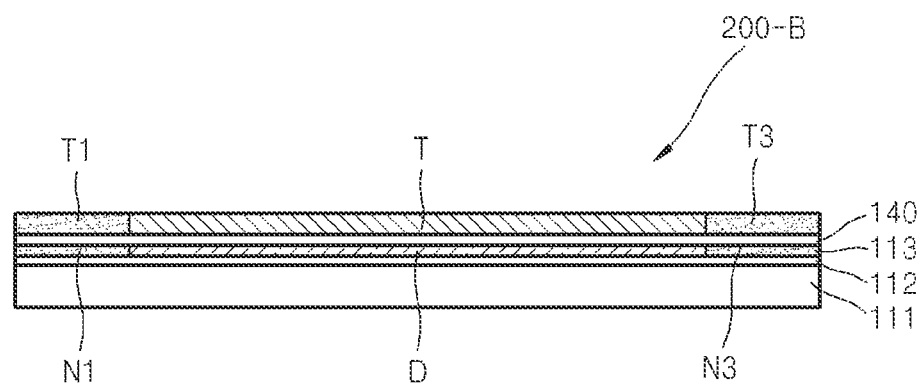
FIG. 13 is a cross-sectional view of a flexible display panel-integrated touch panel before non-display regions of the flexible display panel-integrated touch panel of the embodiment illustrated in FIG. 12 are folded.
Figure 14:
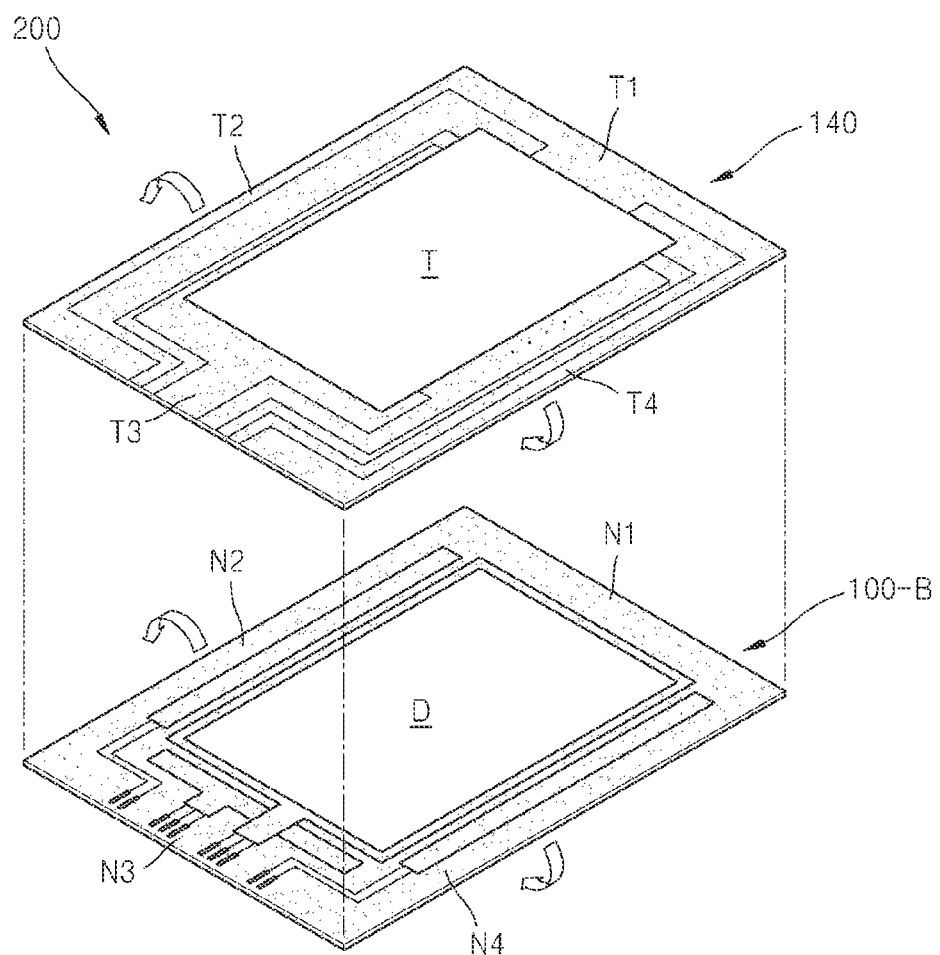
FIG. 14 is an exploded perspective view of the flexible display panel-integrated touch panel of the embodiment illustrated in FIG. 13.

FIG. 12 is a cross-sectional view of a flexible display panel-integrated touch panel 200 according to an embodiment of the present invention, FIG. 13 is a cross-sectional view of a flexible display panel-integrated touch panel 200-B before non-display regions N1 and N3 of the flexible display panel-integrated touch panel 200 illustrated in FIG. 12 are folded, and FIG. 14 is an exploded perspective view of the flexible display panel-integrated touch panel 200-B illustrated in FIG. 13.

Hereinafter, the present embodiment is described with regard to the differences to the embodiment shown in FIG. 1.

Referring to FIG. 12, the flexible display panel-integrated touch panel 200 according to the present embodiment of the present invention is constituted by attaching a touch panel 140 to the flexible display panel 100 illustrated in FIG. 1.

Referring to FIGS. 13 and 14, the touch panel 140 includes a touch region T and wiring regions T1, T2, T3 and T4 outside the touch region T. The touch panel 140 according to the present embodiment may use a variety of touch methods using capacitance overlay, a resistance film, and the like.

A flexible display panel 100-B before non-display regions N1, N2, N3, and N4 are folded includes a display region D and the non-display regions N1, N2, N3, and N4 outside the display region D.

The touch region T of the touch panel 140 and the display region D of the flexible display panel 100-B are aligned with each other so as to correspond to each other so that the touch panel 140 and the flexible display panel 100-B are combined with each other.

In the flexible display panel 100-B combined with the touch panel 140, the non-display regions N1 and N3 of the flexible display panel 100-B, which are on right and left sides of the display region D, are folded in a direction opposite to a direction in which the display region D displays an image to the user. As a result, the flexible display panel-integrated touch panel 200 illustrated in FIG. 12 is constituted.

Because the non-display regions N1 and N3 of the flexible display panel 100-B and the wiring regions T1 and T3 of the touch panel 140 are folded in the direction (rear sheet) opposite to the direction (front sheet) in which the display region D is displayed, when the user sees the flexible display panel-integrated touch panel 200 from the front of the display region D, the user recognizes that a width $W_4$ of the non-display regions N1 and N3 as a border on two opposing sides of (e.g., that surrounds the right and left sides of) the display region D.

As described above, because the width $W_4$ at which the non-display regions N1 and N3 are folded becomes much smaller than an original width $W_0$ before the non-display regions N1 and N3 are folded, the user recognizes that the border of the display region D formed by the non-display regions N1 and N3 is significantly decreased in size.

Although the flexible display panel 100-B of the embodiment illustrated in FIG. 1 is shown in the drawings described above, the present invention is not limited thereto.

Figure 15:
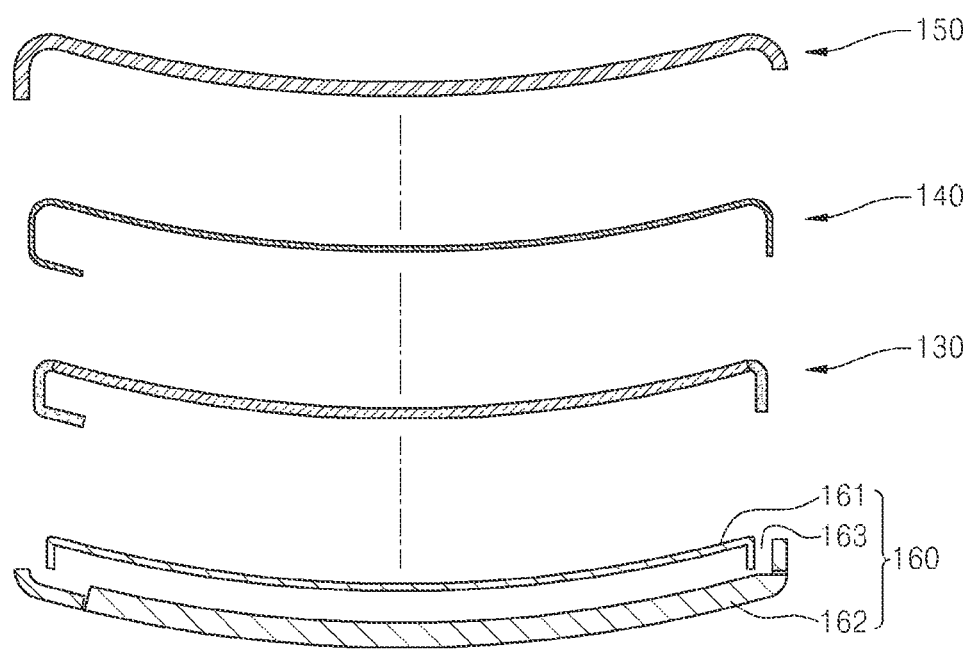
FIGS. 15 and 16 are schematic cross-sectional views of an embodiment of the present invention in which the flexible display panel of the embodiment illustrated in FIG. 1 is combined with a support unit and a housing of a display apparatus.
Figure 16:
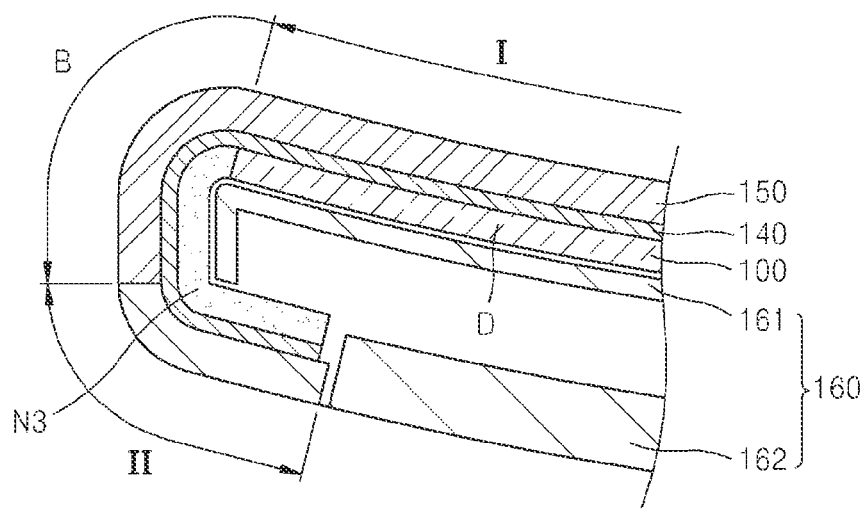

FIGS. 15 and 16 are schematic cross-sectional views of an example in which the flexible display panel 100 of the embodiment shown in FIG. 1 is combined with a transparent protection window 150 and a frame or housing 160 of a display apparatus.

For convenience of explanation, the flexible display panel 100 of the embodiment shown in FIG. 1 is exemplified. However, the present invention is not limited thereto and may apply to the flexible display panel-integrated touch panel 200 of the embodiment illustrated in FIG. 12.

Referring to FIGS. 15 and 16, the flexible display panel 100 is attached to the touch panel 140, and then the non-display region N3 of the flexible display panel 100 is folded, and the flexible display panel 100 is bent in such a way that a display region D of the flexible display panel 100 is formed as a curved surface.

The flexible display panel 100 that has the touch panel 140 attached thereto is protected and supported by the transparent protection window 150.

The transparent protection window 150 may be attached to the flexible display panel 100 to correspond to a shape of the flexible display panel 100, i.e., to correspond to a top surface of the flexible display panel 100 on which an image is displayed, and to correspond to a folded shape of the flexible display panel 100. In other words, the transparent protection window 150 may be combined with the flexible display panel 100 so as to correspond to shapes of the display region D of the flexible display panel 100 and the touch region T of the touch panel 140. The transparent protection window 150 has transmittance that allows light to transmit through a display screen of the flexible display panel 100, and has a strength that maintains the shape of a curved shape of the flexible display panel 100. Thus, the transparent protection window 150 may protect the flexible display panel 100 from external shock or scratches, and may function as a support unit for maintaining the curved shape of the flexible display panel 100 and/or the touch panel 140.

Obviously, in embodiments of the present invention, the support unit for maintaining the curved shape of the flexible display panel 100 and/or the touch panel 140 is not limited to the transparent protection window 150. In other words, the curved shape of the flexible display panel 100 and/or the touch panel 140 may be maintained by the frame or housing 160 of a display apparatus as described below. Alternatively, a variety of other support units may be used.

Although not shown, an adhesive may be injected between the flexible display panel 100 and the transparent protection window 150.

The flexible display panel 100, combined with the transparent protection window 150 and the touch panel 140, is included in a display apparatus. The display apparatus may include the frame or housing 160 for protecting and supporting the display apparatus. In the present embodiment, the flexible display panel 100 is attached to a top surface of a front case 161 of the housing 160, and the non-display regions N1 and N3 described above are folded and seated in an opening 163 between the front case 161 and a lower case 162 of the housing 160 so that the non-display regions N1 and N3 are prevented from being recognized from outside the display apparatus.

The example of FIGS. 15 and 16 are just illustrative of an example in which the flexible display panel 100 is combined with the display apparatus, and various applications may be performed by one of ordinary skill in the art.

As described above, a flexible display panel having its concave curved shape maintained by various support units may be integrated with various display apparatuses, such as TVs, computer monitors, PDAs, smartphones, and the like. Thus, an improved sense of grip or beauty is provided to a user. The ratio of non-display regions to a display region (e.g., the ratio of the area of the non-display regions to the area of the display region) of the flexible display panel recognized by a user is significantly decreased so that an enlarged image screen compared to other display apparatuses may be provided.

A display apparatus according to an embodiment described above has the following effects. First, a display region is formed as a curved surface so that a sense of beauty and a sense of grip is improved. Second, the display region is formed as a curved surface so that the same field of view can be obtained with a smaller area than an area in which the display region is formed as a plane. Third, because a non-display region is hardly recognized (e.g., less pronounced) the display region may be recognized as being borderless.

While this invention has been particularly shown and described with reference to exemplary embodiments thereof, it will be understood by those skilled in the art that various changes in form and details may be made therein without departing from the spirit and scope of the invention as defined by the appended claims. The exemplary embodiments should be considered in descriptive sense only and not for purposes of limitation. Therefore, the scope of the invention is defined not by the detailed description of the invention but by the appended claims and their equivalents, and all differences within the scope will be construed as being included in the present invention.

What is claimed is:

1. A display apparatus comprising:
   a flexible display panel comprising:
      a flexible substrate;
      a display region comprising a first light-emitting device and disposed on a first side of the flexible substrate;
      a first flexible non-display region disposed on the first side of the flexible substrate and disposed outside the display region;
      a border region disposed between the display region and the first flexible non-display region, the border region comprising a second light-emitting device and having a curvature radius;
      a second flexible non-display region disposed on the first side of the flexible substrate and disposed outside the first flexible non-display region, the second flexible non-display region overlapping the display region;
      an encapsulation member encapsulating the display region, the border region, and at least one of the first and second flexible non-display regions;
      a touch layer disposed on the encapsulation member and comprising a touch region and a touch wiring outside the touch region, the touch region overlapping the display region, and the border region and the touch wiring overlapping the first and second flexible non-display regions; and
      a pad unit in the second flexible non-display region on the first side of the flexible substrate, the pad unit overlapping the display region,
   a transparent protection window disposed on the touch layer; and
   an adhesive layer disposed between the touch layer and the transparent protection window.

2. The display apparatus of claim 1,
   wherein the display region and the border region are connected without a boundary.

3. The display apparatus of claim 1, wherein the first and second light-emitting devices of the display region and the border region comprise a first electrode, a second electrode, and an organic light-emitting layer between the first electrode and the second electrode.

4. The display apparatus of claim 2, wherein the border region has a constant curvature radius.

5. The display apparatus of claim 4, wherein the border region has a convex display surface.

6. The display apparatus of claim 1, wherein the display region has a constant curvature radius.

7. The display apparatus of claim 6, wherein the display region has a concave display surface.

8. The display apparatus of claim 1, wherein the encapsulation member comprises an organic layer and an inorganic layer.

9. The display apparatus of claim 1, further comprising a connector coupled with the pad unit,
   wherein the display region overlaps the pad unit and the connector.

10. A display apparatus comprising:
    a flexible display panel comprising:
       a flexible substrate;
       a barrier layer on the flexible substrate;
       a display region disposed on a first side of the barrier layer;
       a first flexible non-display region disposed on the first side of the barrier layer and disposed outside the display region;
       a second flexible non-display region disposed on the first side of the barrier layer and disposed outside the first flexible non-display region, the second flexible non-display region overlapping the display region;
       an encapsulation member encapsulating the display region and at least one of the first and second flexible non-display regions;
       a touch layer disposed on the encapsulation member and comprising a touch region and a touch wiring outside the touch region, the touch region overlapping the display region, and the touch wiring overlapping the first and second non-display regions; and
       a pad unit in the second flexible non-display region on the first side of the barrier layer, the pad unit overlapping the display region,
    a transparent protection window disposed on the touch layer; and
    an adhesive layer disposed between the touch layer and the transparent protection window.

11. The display apparatus of claim 10, further comprising:
    a border region disposed between the display region and the first flexible non-display region, the border region displaying an image.

12. The display apparatus of claim 11, wherein the border region comprises at least one light-emitting device.

13. The display apparatus of claim 12, wherein the light-emitting device comprises a first electrode, a second electrode, and an organic light-emitting layer between the first electrode and the second electrode.

14. The display apparatus of claim 11, wherein the border region has a constant curvature radius.

15. The display apparatus of claim 14, wherein the border region has a convex display surface.

16. The display apparatus of claim 10, wherein the display region has a constant curvature radius.

17. The display apparatus of claim 16, wherein the display region has a concave display surface.

18. The display apparatus of claim 10, wherein the display region comprises at least one light-emitting device.

19. The display apparatus of claim 18, wherein the light-emitting device comprises a first electrode, a second electrode, and an organic light-emitting layer between the first electrode and the second electrode.

20. The display apparatus of claim 10, wherein the encapsulation member comprises an organic layer and an inorganic layer.

21. The display apparatus of claim 10, further comprising a connector coupled with the pad unit,
  wherein the display region overlaps the pad unit and the connector.

* * * * *